US008824851B2

United States Patent
Ruiz et al.

(10) Patent No.: US 8,824,851 B2
(45) Date of Patent: Sep. 2, 2014

(54) COMMUNICATIONS ENCLOSURE HAVING REAR MOUNTED BRACKET AND METHOD OF SECURING A CABLE BUNDLE TO A COMMUNICATIONS ENCLOSURE USING A REAR MOUNTED BRACKET

(75) Inventors: Gil Ruiz, McKinney, TX (US); Johnny Zheng, SuZhou (CN)

(73) Assignee: CommScope, Inc. of North Carolina, Hickory, NC (US)

( * ) Notice: Subject to any disclaimer, the term of this patent is extended or adjusted under 35 U.S.C. 154(b) by 419 days.

(21) Appl. No.: 13/218,481

(22) Filed: Aug. 26, 2011

(65) Prior Publication Data

US 2012/0051709 A1 Mar. 1, 2012

Related U.S. Application Data

(60) Provisional application No. 61/377,645, filed on Aug. 27, 2010.

(51) Int. Cl.
| | |
|---|---|
| G02B 6/44 | (2006.01) |
| H05K 7/14 | (2006.01) |
| H04Q 1/06 | (2006.01) |
| H04Q 1/10 | (2006.01) |
| H04Q 1/02 | (2006.01) |

(52) U.S. Cl.
CPC ............ *H05K 7/1447* (2013.01); *G02B 6/4471* (2013.01); *H04Q 1/06* (2013.01); *H04Q 1/10* (2013.01); *H04Q 1/025* (2013.01); *G02B 6/4452* (2013.01)

USPC .......................................... 385/136; 385/135

(58) Field of Classification Search
None
See application file for complete search history.

(56) References Cited

U.S. PATENT DOCUMENTS

| | | | | |
|---|---|---|---|---|
| 5,661,840 | A * | 8/1997 | Caveney ........................ | 385/135 |
| 5,933,563 | A * | 8/1999 | Schaffer et al. ................ | 385/135 |
| 2002/0136520 | A1 | 9/2002 | Janus | |
| 2002/0197045 | A1* | 12/2002 | Schmidt et al. ................ | 385/134 |
| 2003/0007767 | A1 | 1/2003 | Douglas | |
| 2003/0223723 | A1 | 12/2003 | Massey | |
| 2005/0111810 | A1 | 5/2005 | Giraud | |
| 2007/0104450 | A1* | 5/2007 | Phung et al. ................... | 385/137 |
| 2009/0226143 | A1* | 9/2009 | Beck .............................. | 385/135 |
| 2010/0054686 | A1* | 3/2010 | Cooke et al. ................... | 385/135 |
| 2010/0296789 | A1* | 11/2010 | Womack et al. ............... | 385/135 |
| 2013/0058616 | A1* | 3/2013 | Cote et al. ...................... | 385/137 |

* cited by examiner

*Primary Examiner* — Mike Stahl
(74) *Attorney, Agent, or Firm* — Muncy, Geissler, Olds & Lowe, P.C.

(57) ABSTRACT

A communications enclosure has an interior, a front, a rear, first and second sides extending from the front to the rear, and a rear wall at or near the enclosure rear and including a mounting surface generally perpendicular to the first side. A bracket has a first portion overlying the rear wall mounting surface, is releasably connected to the rear wall mounting surface, and is configured to secure a cable bundle to the rear wall mounting surface.

20 Claims, 3 Drawing Sheets

COMMUNICATIONS ENCLOSURE HAVING REAR MOUNTED BRACKET AND METHOD OF SECURING A CABLE BUNDLE TO A COMMUNICATIONS ENCLOSURE USING A REAR MOUNTED BRACKET

CROSS-REFERENCE TO RELATED APPLICATIONS

The present application claims the benefit of U.S. Provisional Patent Application No. 61/377,645, filed Aug. 27, 2010, the entire contents of which are hereby incorporated by reference.

FIELD OF THE INVENTION

The present invention is directed to a communications enclosure having a bracket for securing a bundle of optical cables near the rear of the enclosure and to a method of securing a cable bundle to an enclosure, and, more specifically, toward a communications enclosure having a bracket that is accessible from the rear of the enclosure for securing a cable bundle near the rear of the enclosure and to a method of securing a cable bundle near the rear of an enclosure.

BACKGROUND OF THE INVENTION

Communications enclosures are known that contain various components for guiding, splicing and/or connecting incoming optical cables, from an optical trunk line, for example, to individual patch cords that connect to optical components in a building. These enclosures may be mounted in a stacked arrangement in a rack, and multiple racks may be arranged in a row with a limited amount of space therebetween. Conventionally, the incoming cable bundles enter the enclosure from a location near the rear of the enclosure and connect to a bulkhead supporting a plurality of adapters inside the enclosure. Patch cords are connected to the adapters and exit from the front of the enclosure. The bundles of cables may approach the rack from the floor or ceiling of a room housing a rack of the enclosures and travel up or down the sides of the racks until they reach the level of the enclosure to which they are to be connected.

It is known to provide brackets on the sides of enclosures for securing an incoming cable bundle to the enclosure. However, these brackets often project from the sides of the enclosures and require a minimum spacing between adjacent racks to accommodate the brackets and associated optical cable bundles. Furthermore, the brackets are generally mounted to the sides of the enclosure, and an installer must therefore have access to the side of the enclosure to install or remove a bracket or reposition a bundle. This may require leaving sufficient space between the racks to allow an installer and/or his tools to reach the mounting location or the use of racks that can be pulled individually out of a row to allow access to the side faces of the enclosures. It would be desirable to mount incoming bundles to an enclosure in a manner that does not require access to the sides of the enclosure and that minimizes side clearance requirements.

SUMMARY OF THE INVENTION

This problem and others are addressed by embodiments of the present invention, a first aspect of which comprises a communications enclosure having an interior, a front, a rear, and first and second sides extending from the front to the rear. A rear wall is located at or near the enclosure rear and includes a mounting surface generally perpendicular to the first side. A bracket has a first portion overlying the rear wall mounting surface, is releasably connected to the rear wall mounting surface, and is configured to secure a cable bundle to the rear wall mounting surface.

Another aspect of the invention comprises a communications enclosure having an interior, a front, a rear, and first and second sides extending from the front to the rear. A rear wall arrangement is located at or near the enclosure rear and includes a mounting surface generally perpendicular to the first side. A bracket mechanism has a first portion overlying the rear wall mounting surface, is releasably connected to the rear wall mounting surface, and includes a securing mechanism for securing a cable bundle to the rear wall mounting surface.

A further aspect of the invention comprises a method of mounting a cable bundle at the rear of a communications enclosure having a front, a rear, a top, a bottom and a rear-facing support, where the rear facing support includes first and second rear facing mounting openings. The method includes providing a first bracket having a first portion having a mounting hole and a second portion projecting away from the first portion, aligning the mounting hole with the first mounting opening, inserting a fastener through the aligned mounting hole and the first mounting opening, placing a cable bundle against the bracket second portion and securing the cable bundle to the second portion.

BRIEF DESCRIPTION OF THE DRAWINGS

These aspects of the invention and others will be better understood after a reading of the following detailed description in connection with the attached drawings wherein.

DETAILED DESCRIPTION

Figure 1:
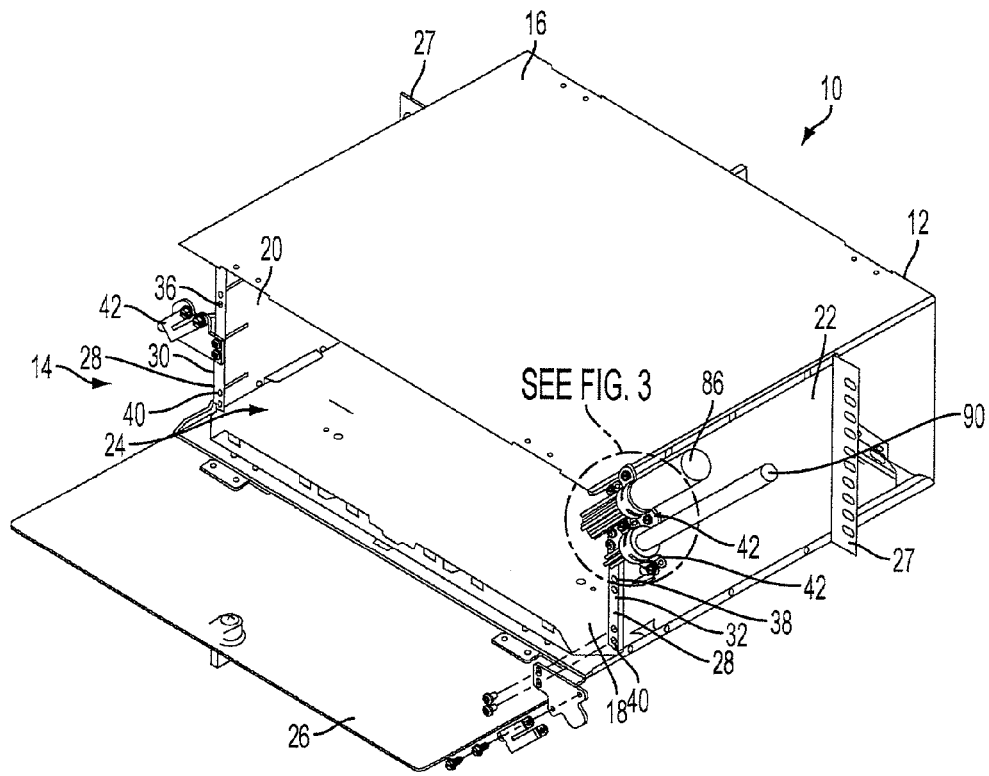
FIG. 1 is a rear perspective view of a communications enclosure having rear-mounted brackets according to an embodiment of the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

A communications enclosure 10 according to an embodiment of the present invention is illustrated in FIG. 1 and includes a front 12, a rear 14, a top 16, a bottom 18, a first side 20, a second side 22 and an interior 24. A door 26 is hingedly mounted at housing rear 14, and support brackets 27 for mounting the enclosure 10 in a rack (not illustrated) are also provided. A rear wall 28 comprises a first flange 30 projecting from first side 20 and a second flange 32 projecting from second side 22 and is located near the rear 14 of the enclosure 10 but spaced inwardly from door 26. Rear wall 28 could be located closer to the rear 14 of the enclosure 10 but is beneficially spaced somewhat forward of the rear 14 to provide a space for cables to enter the enclosure from one or both sides. Embodiments of the present invention will be described in connection with bundles of optical cables that connect to enclosure 10; however, various non-optical cables could also be attached to enclosure 10 in a similar manner, and references to "cables" or "cable bundles" herein are intended to cover both optical and non-optical media. As illustrated in FIG. 1, the top 16 and bottom 18 of the enclosure 10 may also project beyond rear wall 28, but rear wall 28 defines opposite sides of a rear opening into interior 24 and is thus described herein as a rear wall even though certain elements of an enclosure are located further away from the enclosure front.

First flange 30 and second flange 32 of rear wall 28 each comprise a rear facing mounting surface 34 having an upper pair of mounting openings 36, a central pair of mounting openings 38 and a lower pair of mounting openings 40. More or fewer sets of mounting openings could be provided depending on the size of the enclosure 10 and the number of elements that require mounting near the rear 14 of the enclosure. One bracket 42 for supporting incoming bundles of cables is connected to first flange 30 of rear wall 28 and two additional brackets 42 are shown mounted to the upper mounting openings 36 and central mounting openings 38 of second flange 32.

Figure 2:
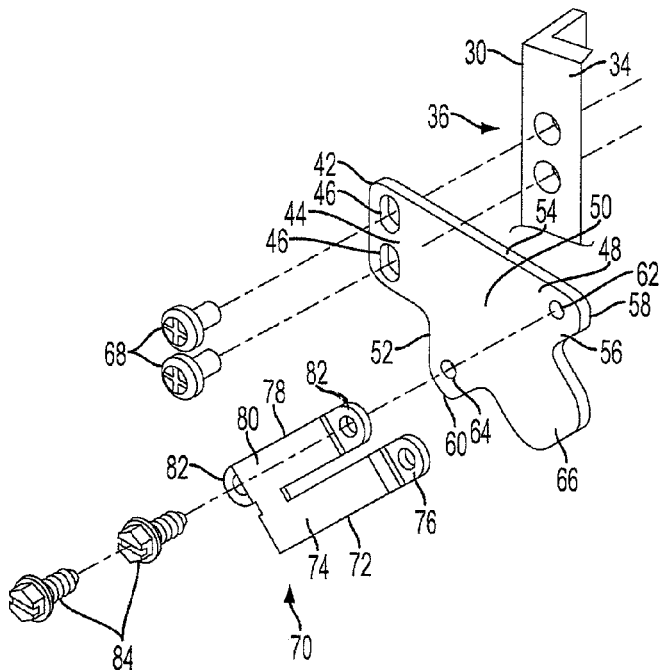
FIG. 2 is an exploded perspective view of one of the brackets of FIG. 1.

Referring now to FIG. 2, bracket 42 includes a first portion 44 having first and second mounting holes 46 which are aligned with any of the upper, central or lower pairs of mounting openings 36, 38, 40, on the first or second flange 30, 32 with part or all of the first portion 44 lying substantially flush against the mounting surface 34 of the first or second flange 30, 32. Bracket 42 also includes a second portion 48 extending from one side of first portion 44 which second portion 48 extends away from the interior 24 of the enclosure 10 when the bracket 42 is mounted on the rear wall 28. Second portion 48 includes a substantially triangular section 50 having a first edge 52 connected to first portion 44, a second edge 54 perpendicular to first edge 52 and substantially collinear with an edge of first portion 44 and a third edge 56 that connects the first edge 52 to the second edge 54. Second edge 54 and third edge 56 meet at a region referred to herein as a first vertex 58 even though in the figures the meeting location is rounded and not a meeting point of two straight edges, and first edge 52 and third edge 56 meet at a second vertex 60. A first mounting aperture 62 is located at first vertex 58 and a second mounting aperture 64 is located at second vertex 60. A tongue 66 projects from a center portion of third edge 56 away from first portion 44 which tongue portion 66 is narrower than third edge 56. As will be appreciated from FIG. 2, the first and second mounting aperture 62, 64 are located on a line that is angled at approximately 45 degrees to a line connecting the centers of first and second mounting holes 46 on first portion 44. Connectors 68, which may comprise, for example, screws or bolts, extend through mounting holes 46 on the first portion 44 and the mounting openings 36 therebehind to secure the bracket 42 to the enclosure 10.

Bracket 42 also includes a fastener 70 having a first holding element 72 with a first curved portion 74 and first and second mounting tabs 76 and a second holding element 78 having a curved portion 80 connected to first curved portion 74 and including first and second mounting tabs 82. Second holding element 78 is smaller than first holding element 72, and the first and second mounting tabs 82 of the second holding element 78 lie in a plane spaced from the plane in which the first and second mounting tabs 76 of the first holding element 72 lie. The different sizes of the first and second holding elements 72, 78 allow fastener 70 to be used to secure cable bundles having different diameters as discussed below.

In use, bracket 42 is mounted on rear wall 28 of housing 10 in one of four different orientations with respect to the housing. When mounted on the first flange 30 on the left side of enclosure 10 as viewed in FIG. 1, tongue portion 66 projects to the left, away from interior 24 and will point in the direction of top 16 or bottom 18 of enclosure 10 depending on the arrival direction of the incoming cable bundle. Beneficially, the same bracket 42 can be used on either side of enclosure 10 with tongue portion 66 facing either top 16 or bottom 18 thus reducing the need for different brackets for different mounting positions.

Figure 3:
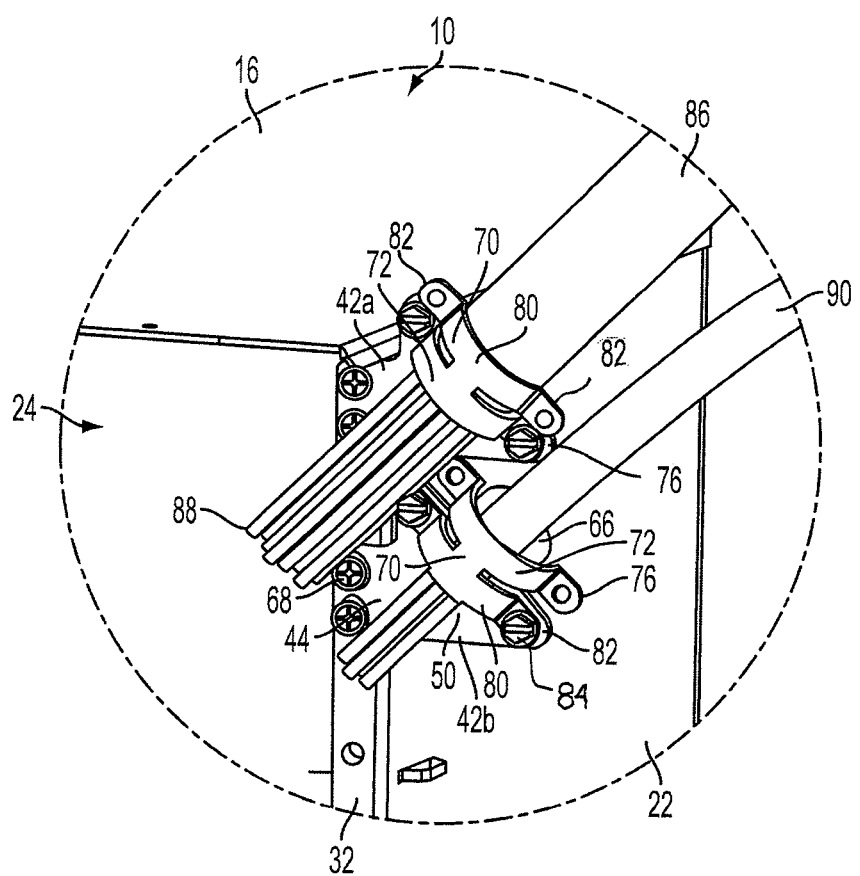
FIG. 3 is a detail view of region III in FIG. 1.

With reference to FIG. 3, a first bracket 42 is mounted to upper mounting openings 36 on second flange 32 and a second bracket 42 is mounted to the central mounting openings 38 of second flange 32. These brackets are identical but will be referred to as brackets 42a and 42b respectively in this Figure to distinguish them from one another. A first cable bundle 86 approaches the enclosure 10 from above, and lies against tongue portion 66 and triangular section 50 of second portion 48 of bracket 42a, and individual fibers 88 from first cable bundle 86 overlie first portion 44 of the bracket 42a and extend past second flange 32 to a location from which they can enter the interior 24 of enclosure 10. First cable bundle 86 is relatively large, and fastener 70 is therefore positioned over first bundle 86 with the mounting tabs 76 of first holding element 72 connected to the first and second mounting apertures 62, 64 on second portion 48 via screws 84 to secure the first cable bundle 86 to the upper bracket 42a. First holding element 72 and second holding element 78 each have similar curvatures and engage a sidewall of the first cable bundle 86; however, because first holding element 72 is larger than second holding element 78, only the mounting tabs 76 of first holding element 72 reach the plane of triangular section 50. The mounting tabs 82 of the second holding element 78 are spaced from the plane of triangular section 50 on the same side of second portion 48 as the fastener 70.

A second cable bundle 90 also approaches enclosure 10 from the upper right as viewed in FIG. 3, but second cable bundle 90 has a smaller diameter than first cable bundle 86 and thus may not be adequately secured by first holding portion 72 of the fastener 70. Therefore, fastener 70 is positioned with the mounting tabs 82 of second holding element 78 aligned with and attached to first and second mounting apertures 62, 64 of triangular section 50, via screws 84. Hence, the second holding element 78 holds second cable bundle 90 against the bracket 42b. Tongue section 66 provides support for the incoming second cable bundle 90 to reduce bending stresses on the cable bundle 90 while at the same time allowing the mounting tabs 76 and a portion of curved portion 74 of first holding element 72 to extend past the plane of the triangular portion 50. Of course, triangular portion 50 could be replaced with a different shape and/or tongue 66 could be dispensed with if bracket 42 were always used with the same sized cable bundle or if a variety of fasteners 70 of different sizes were provided to accommodate different sizes of cable bundles.

Figure 4:
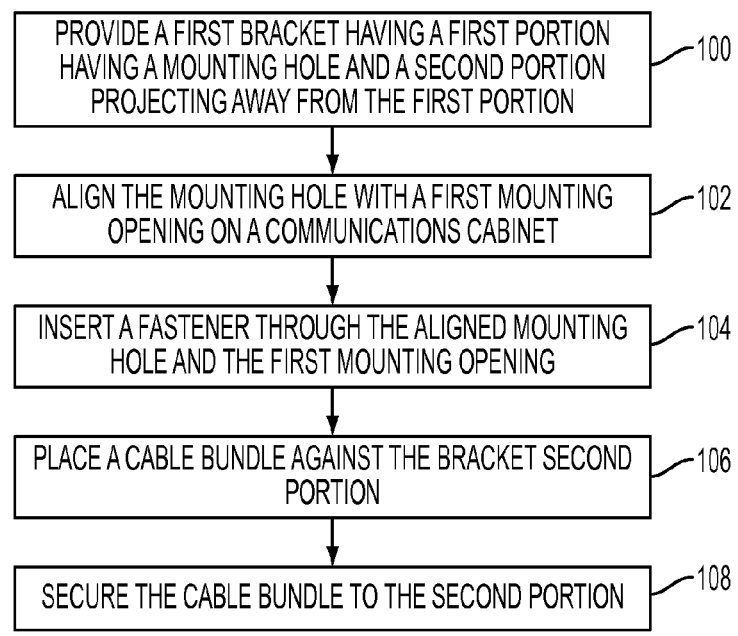
FIG. 4 is a flow chart illustrating a method according to an embodiment of the present invention.

FIG. 4 illustrates a method according to an embodiment of the present invention which includes a step 100 of providing a first bracket having a first portion having a mounting hole and a second portion projecting away from the first portion, a step 102 of aligning the mounting hole with a first rear facing mounting opening of a communications enclosure, a step 104 of inserting a fastener through the aligned mounting hole and the first mounting opening, a step 106 of placing a cable bundle against the bracket second portion and a step 108 of securing the cable bundle to the second portion.

The present invention has been described herein in terms of a presently preferred embodiment. However, various additions and modifications to this embodiment will become apparent to persons of ordinary skill in the relevant art upon a reading of the foregoing description. It is intended that all such additions and modifications comprise a part of the present invention to the extent they fall within the scope of the several claims append hereto.

We claim:

1. A communications enclosure comprising:
   a front;
   a rear;
   a bottom;
   first and second sides extending from said front to said rear;
   a rear wall at or near said enclosure rear, said rear wall extending at an angle relative to said bottom, an interior of said enclosure existing between said rear wall and said first and second sides and above said bottom, and said rear wall including a mounting surface generally perpendicular to said first side; and
   a bracket having a first portion overlying said rear wall mounting surface and releasably connected to said rear wall mounting surface, said bracket being configured to secure a cable bundle to said rear wall mounting surface, and said bracket including a second portion projecting from said first portion away from said interior and beyond said first side.

2. The communications enclosure of claim 1, wherein said rear wall mounting surface includes a mounting opening and said bracket first portion includes a mounting hole aligned with said mounting opening and including a connector extending through said mounting opening and said mounting hole and securing said bracket to the enclosure.

3. The communications enclosure of claim 2, wherein said second portion includes a mounting surface, and wherein said bracket further includes a fastener for securing a cable bundle to said mounting surface.

4. The communications enclosure of claim 3, wherein said mounting surface includes first and second fastener mounting apertures, a distance between said first and second fastener mounting apertures being greater than any dimension of said first portion.

5. The communications enclosure of claim 1, wherein said rear wall comprises a first flange extending from said first side and a second flange extending from said second side.

6. The communications enclosure of claim 3, wherein said fastener comprises a curved band having first and second mounting tabs secured to said bracket second portion.

7. The communications enclosure of claim 3, wherein said bracket first portion and said bracket second portion are substantially coplanar.

8. The communications enclosure of claim 3, wherein said second portion comprises a triangular section having a vertex at said first portion and a side edge opposite said vertex, a mounting aperture at an end of said side edge, and a tongue portion projecting from said side edge for supporting the cable bundle secured to said mounting surface.

9. The communications enclosure of claim 8, wherein said fastener comprises a first holding element with a first holding element curved portion having a first size and first and second mounting tabs projecting from said first holding element curved portion, a second holding element connected to said first holding element and including a second holding element curved portion having a second size larger than said first size and first and second mounting tabs projecting from said second holding element curved portion, wherein said second holding element curved portion extends past opposite sides of said tongue portion when said mounting tabs of said first holding element are mounted on said triangular section.

10. The communications enclosure of claim 1,
   wherein said rear wall mounting surface includes first and second mounting openings and said bracket first portion includes first and second mounting holes aligned with said first and second mounting openings,
   wherein said enclosure includes first and second connectors extending through said first and second mounting openings and said first and second mounting holes and securing said bracket to said enclosure, wherein said second portion includes a triangular section having a first edge connected to said first portion, a second edge forming a first vertex with said first edge and a third edge connecting said first edge and said second edge, a first mounting aperture located at a second vertex formed by said first edge and said third edge, a second mounting aperture located at a third vertex formed by said second edge and said third edge, said second portion further comprising a tongue section projecting from said third edge, spaced from said second vertex and said third vertex and having a width less than a length of said third edge.

11. The communications enclosure of claim 9, wherein said bracket first portion, triangular section and tongue section are coplanar.

12. The communications enclosure of claim 1,
wherein said rear wall mounting surface comprises a first flange having first and second mounting openings and said bracket first portion includes first and second mounting holes aligned with said first and second mounting openings;
wherein a first connector extends through said first mounting opening and said first mounting hole, said first connector including a head spaced from said rear wall mounting surface by said bracket first portion, said first connector securing said bracket to the enclosure;
wherein a second connector extends through said second mounting opening and said second mounting hole;
wherein said second portion includes a triangular section having a first edge connected to said first portion, a second edge forming a first vertex with said first edge and a third edge connecting said first edge and said second edge, a first mounting aperture located at a second vertex formed by said first edge and said third edge, a second mounting aperture located at a third vertex formed by said second edge and said third edge, said second portion further comprising a tongue section projecting from said third edge, spaced from said second vertex and said third vertex and having a width less than a length of said third edge;
said bracket further including a fastener for securing the cable bundle to said second portion, said fastener comprising a first holding element with a first holding element curved portion having a first size and first and second mounting tabs projecting from said first holding element curved portion, a second holding element connected to said first holding element and including a second holding element curved portion having a second size smaller than said first size and first and second mounting tabs projecting from said second holding element curved portion, wherein said first holding element curved portion extends past opposite sides of said tongue section when said mounting tabs of said second holding element are mounted on said triangular section.

13. A communications enclosure comprising:
a front;
a rear;
a bottom;
first and second sides extending from said front to said rear;
rear wall means at or near said enclosure rear, said rear wall means extending at an angle relative to said bottom, an interior of said enclosure existing between said rear wall means and said first and second sides and above said bottom, and said rear wall means including a mounting surface generally perpendicular to said first side; and
bracket means having a first portion overlying said rear wall mounting surface and releasably connected to said rear wall mounting surface, said bracket means including securing means for securing a cable bundle to said rear wall mounting surface and said bracket means including a second portion projecting from said first portion away from said interior and beyond said first side.

14. The communications enclosure of claim 13, wherein said rear wall means comprises a first flange projecting from said enclosure first side and a second flange projecting from said enclosure second side.

15. The communications enclosure of claim 13, wherein said second portion accepts said securing means for supporting the cable bundle.

16. The communications enclosure of claim 13, wherein said securing means comprises an arcuate band releasably secured to said bracket means.

17. A method of mounting a cable bundle at the rear of a communications enclosure having a front, a rear, first and second sides extending from the front to the rear, a top, a bottom and a rear-facing support, the rear facing support extending at an angle relative to the bottom, an interior of the enclosure existing between the rear-facing support and the first and second sides and above the bottom and below the top, the rear-facing support including first and second rear facing mounting openings, the method comprising:
providing a first bracket having a first portion having a mounting hole and a second portion projecting away from the first portion;
aligning the mounting hole with the first mounting opening, so that the second portion of the first bracket projects away from the interior and beyond the first side;
inserting a fastener through the aligned mounting hole and the first mounting opening;
placing a cable bundle against the bracket second portion; and
securing the cable bundle to the second portion.

18. The method of claim 17 wherein the bracket second portion comprises a triangular section having a vertex at the first portion and a side edge opposite the vertex, a mounting aperture at an end of the side edge, and a tongue portion projecting from the side edge for supporting the cable bundle secured to the mounting surface and wherein placing a cable bundle against the bracket comprises placing the cable bundle on the tongue across the side edge and over the vertex.

19. The method of claim 17 wherein inserting a fastener comprises inserting the fastener first through the mounting hole and then through the first mounting opening.

20. The method of claim 17, wherein the first bracket is mounted near the bottom of the enclosure and the second mounting opening is located near the top of the enclosure, the method further including providing a second bracket having a first portion having a mounting hole and a second portion projecting away from the first portion;
aligning the mounting hole of the second bracket with the second mounting opening;
inserting a fastener through the aligned second bracket mounting hole and the second mounting opening;
placing a cable bundle against the second bracket second portion; and
securing the cable bundle to the second bracket second portion.

* * * * *